(12) United States Patent
Elkins

(10) Patent No.: US 9,125,302 B2
(45) Date of Patent: Sep. 1, 2015

(54) ELECTRONIC EQUIPMENT ENCLOSURES AND METHODS RELATED THERETO

(75) Inventor: Jin Elkins, Auburn, AL (US)

(73) Assignee: Emerson Network Power, Energy Systems, North America, Inc., Warrenville, IL (US)

( * ) Notice: Subject to any disclaimer, the term of this patent is extended or adjusted under 35 U.S.C. 154(b) by 374 days.

(21) Appl. No.: 13/453,777

(22) Filed: Apr. 23, 2012

(65) Prior Publication Data

US 2013/0278120 A1 Oct. 24, 2013

(51) Int. Cl.
*H05K 7/20* (2006.01)
*H05K 5/02* (2006.01)

(52) U.S. Cl.
CPC .......... *H05K 5/0213* (2013.01); *H05K 7/20572* (2013.01); *Y10T 29/49826* (2015.01)

(58) Field of Classification Search
CPC ... H05K 5/0213; H05K 7/20572; H05K 7/20; H02B 1/56; B01D 11/0449; B01D 11/0453; B01D 45/06; B01D 45/08; B01D 45/12; B01D 45/16; B01D 50/002
USPC .............. 454/184; 361/679.51, 695; 312/236; 55/442, 443, 444, 445, 462
See application file for complete search history.

(56) References Cited

U.S. PATENT DOCUMENTS

| | | | |
|---|---|---|---|
| 248,354 A * | 10/1881 | Schmandt | 55/444 |
| 1,211,235 A * | 1/1917 | Robertson | 55/282 |
| 5,034,035 A * | 7/1991 | Satmer et al. | 55/321 |
| 5,064,621 A * | 11/1991 | Uyama et al. | 422/144 |
| 5,332,872 A * | 7/1994 | Ewanek | 181/224 |
| 6,105,875 A * | 8/2000 | LaGrotta et al. | 236/44 A |
| 6,643,130 B1 * | 11/2003 | DeMarchis et al. | 361/695 |
| 7,345,875 B2 | 3/2008 | Elkins | |
| 7,379,299 B2 * | 5/2008 | Walsh et al. | 361/695 |
| 2006/0120045 A1 * | 6/2006 | Van Der Werff | 361/697 |
| 2011/0159795 A1 | 6/2011 | Sprague et al. | |

* cited by examiner

*Primary Examiner* — Gregory Huson
*Assistant Examiner* — Dana Tighe
(74) *Attorney, Agent, or Firm* — Harness, Dickey & Pierce, P.L.C.

(57) ABSTRACT

Electronic equipment enclosures of the present disclosure are configured to house electronic equipment. The enclosures generally include vent opening configured to allow air to flow into and out of the enclosures, and fans configured to circulate the air within the enclosures around the electronic equipment housed therein. The enclosures also include backflow assemblies located between the vent openings and the fans, and configured to inhibit movement of unwanted materials through the enclosures between the vent openings and the fans. In addition, the backflow assemblies may include multiple vanes disposed adjacent the vent openings and arranged to block straight paths from the vent openings into the enclosures past the multiple vanes. The multiple vanes may be operable both to inhibit the movement of the unwanted materials through the enclosures and to allow air to flow out of the vent openings from the enclosures without moving.

16 Claims, 8 Drawing Sheets

ELECTRONIC EQUIPMENT ENCLOSURES AND METHODS RELATED THERETO

FIELD

The present disclosure generally relates to enclosures for electronic equipment and methods for making and using such enclosures.

BACKGROUND

This section provides background information related to the present disclosure which is not necessarily prior art.

Electronic equipment enclosures are often used for housing and protecting electronic equipment such as, for example, telecommunications equipment, cable television (CATV) equipment, data transmission equipment, etc. As an example, telecommunications enclosures are commonly used in the telecommunications industry to house connections and/or components for use in distributing telecommunications services (e.g., telephone, television, radio, computer network, internet, etc.) to one or more customer locations.

In addition, electronic equipment enclosures are typically installed in a variety of different locations, including indoor and outdoor environments. When installed in outdoor environments, the enclosures may be exposed to very warm, cold, wet, dry, dusty, sandy, salty and/or windy conditions. The enclosures must be able to resist such harsh weather conditions in order to protect the equipment housed in the enclosures against damage that could be caused by these conditions.

SUMMARY

This section provides a general summary of the disclosure, and is not a comprehensive disclosure of its full scope or all of its features.

Example embodiments of the present disclosure are generally directed toward electronic equipment enclosures. In one example embodiment, an enclosure generally includes a vent opening defined in the electronic equipment enclosure and configured to allow air to flow into the electronic equipment enclosure, and multiple vanes disposed within the electronic equipment enclosure adjacent the vent opening. The multiple vanes are arranged to block a straight path from the vent opening into the electronic equipment enclosure past the multiple vanes.

In another example embodiment, an enclosure generally includes a housing configured to hold the electronic equipment and defining a vent opening configured to allow air to flow into the housing, at least one fan positioned within the housing and configured to move air within the housing, and multiple vanes coupled to the housing and disposed between the vent opening and the at least one fan. The multiple vanes are configured both to inhibit movement of unwanted materials through the housing from the vent opening to the at least one fan and to allow air to flow out of the vent opening from the housing without moving.

Example embodiments of the present disclosure are also generally directed toward methods of making electronic equipment enclosures. In one example embodiment, a method is provided for making an enclosure suitable for housing electronic equipment and at least one fan for circulating air in the electronic equipment enclosure around the electronic equipment, wherein the electronic equipment enclosure includes a backflow assembly configured to inhibit movement of unwanted materials through a housing of the electronic equipment enclosure from a vent opening of the housing to the at least one fan of the housing. In this embodiment, the method generally includes coupling multiple vanes of the backflow assembly to the housing between the vent opening and the at least one fan, and arranging the multiple vanes of the backflow assembly to block a straight path into the housing from the vent opening to the at least one fan.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
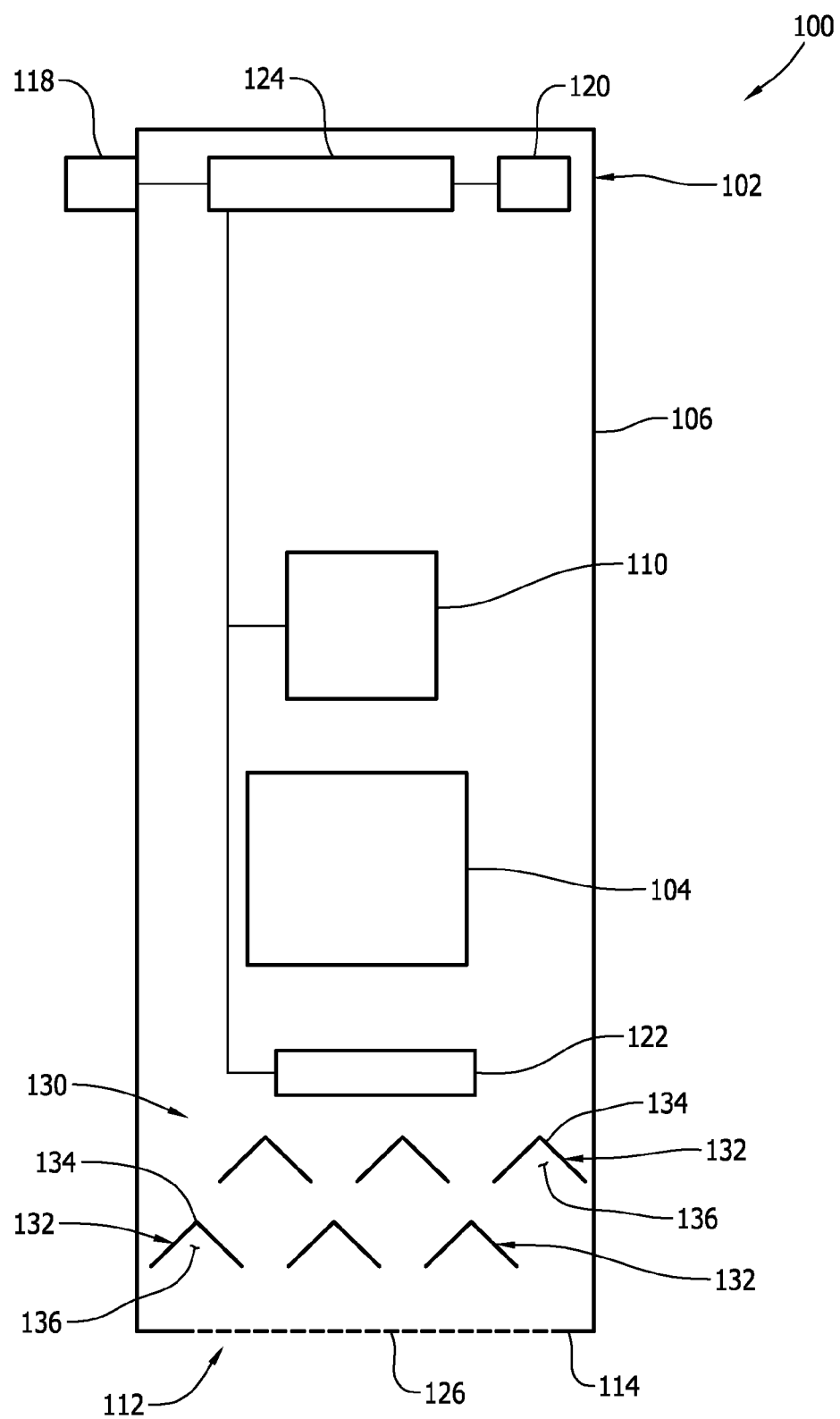
FIG. 1 is a side elevation view of an electronic equipment enclosure according to one example embodiment of the present disclosure, with part of a housing of the enclosure removed to show internal components of the enclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "forward," "rearward," "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

As will be apparent, the teachings of the present disclosure can be implemented in a wide variety of enclosures (e.g., cabinets, etc.) of various types, sizes, and configurations (referred to as embodiments, etc.). For example, the various teachings of this disclosure can be applied to, without limitation, electronic equipment enclosures for telecommunications equipment, cable television (CATV) equipment, data transmission equipment, other electronic equipment, etc.

The enclosures of the present disclosure can be used in any desired environment, including indoor and outdoor environments. As such, the enclosures typically include vent openings (e.g., exhaust openings, intake openings, etc.) to allow ambient air to flow into and/or out of the enclosures to help control temperature, humidity, etc. within the enclosures. These vent openings can be located at one or more various locations around the enclosures, and individual enclosures may include one or more vent openings as desired.

Various enclosures of the present disclosure may include thermal control systems (e.g., ventilation systems having one or more fans, ventilation systems having one or more air conditioning units, heating systems, combinations thereof, etc.) configured to actively generate airflow in the enclosures (e.g., by drawing air into the enclosures through vent openings, by forcing air out of the enclosures through vent openings, etc.) to further help control the temperature, humidity, etc. within the enclosures. And, the thermal control systems and/or the electronic equipment housed within the enclosures can be selectively located so that the airflow is directed generally toward, over, around, etc. the equipment. Such airflow may follow any desired paths through the enclosures, for example, generally downward paths, generally upward paths, generally horizontal paths, generally vertical paths, generally circulating paths, various combinations of such paths, etc.

With that said, the enclosures of the present disclosure are uniquely configured to help inhibit ingress, movement, etc. of unwanted materials (e.g., solid particles such as dust and salt, moisture such as mist and snow, etc.) via airflow into and through the enclosures, for example, through the vent openings in the enclosures, etc. (e.g., via exhaust backflow, via ambient air passively blowing through the vent openings, via ambient air actively drawn through the vent openings, etc.). This provides protection to the thermal control systems, electronic equipment, etc. located in the enclosures against damage that could result if such unwanted materials come into contact with them. To accomplish this, the enclosures include backflow assemblies configured to remove the unwanted materials from air flowing into the enclosures before they reach the thermal control systems, electronic equipment, etc. These backflow assemblies are typically associated with the vent openings (e.g., exhaust openings, etc.) of the enclosures. As such, they are typically located between the vent openings and the thermal control systems, electronic equipment, etc. to provide the thermal control systems, electronic equipment, etc. with the desired protection against the unwanted materials flowing into the enclosures through the vent openings.

In various enclosures of the present disclosure, the backflow assemblies include non-moving structures such as vanes, channels, etc. uniquely shaped and/or arranged to remove the unwanted materials from the air flowing in through the vent openings (before reaching the thermal control systems, electronic equipment, etc. in the enclosures). Such structures allow the air to both flow into and out of the enclosures through the vent openings (without requiring the structures to move or be adjusted to accommodate the different air flows). However, with regard to the air flowing into the enclosures, the structures operate to disrupt and reduce velocity of the inflowing air, in turn reducing momentum of the unwanted materials carried in the air and causing them to fall out. For example, unwanted solids in the inflowing air become too heavy to remain suspended and fall out before reaching the thermal control systems, electronic equipment, etc. And, unwanted moisture in the inflowing air coalesces and similarly falls out before reaching the thermal control systems, electronic equipment, etc. Collection units may be provided to gather the removed materials for subsequent disposal, or the removed materials may simply fall back out of the enclosures through the vent openings.

Example embodiments of enclosures and related methods will now be described more fully with reference to the accompanying drawings.

Figure 2:
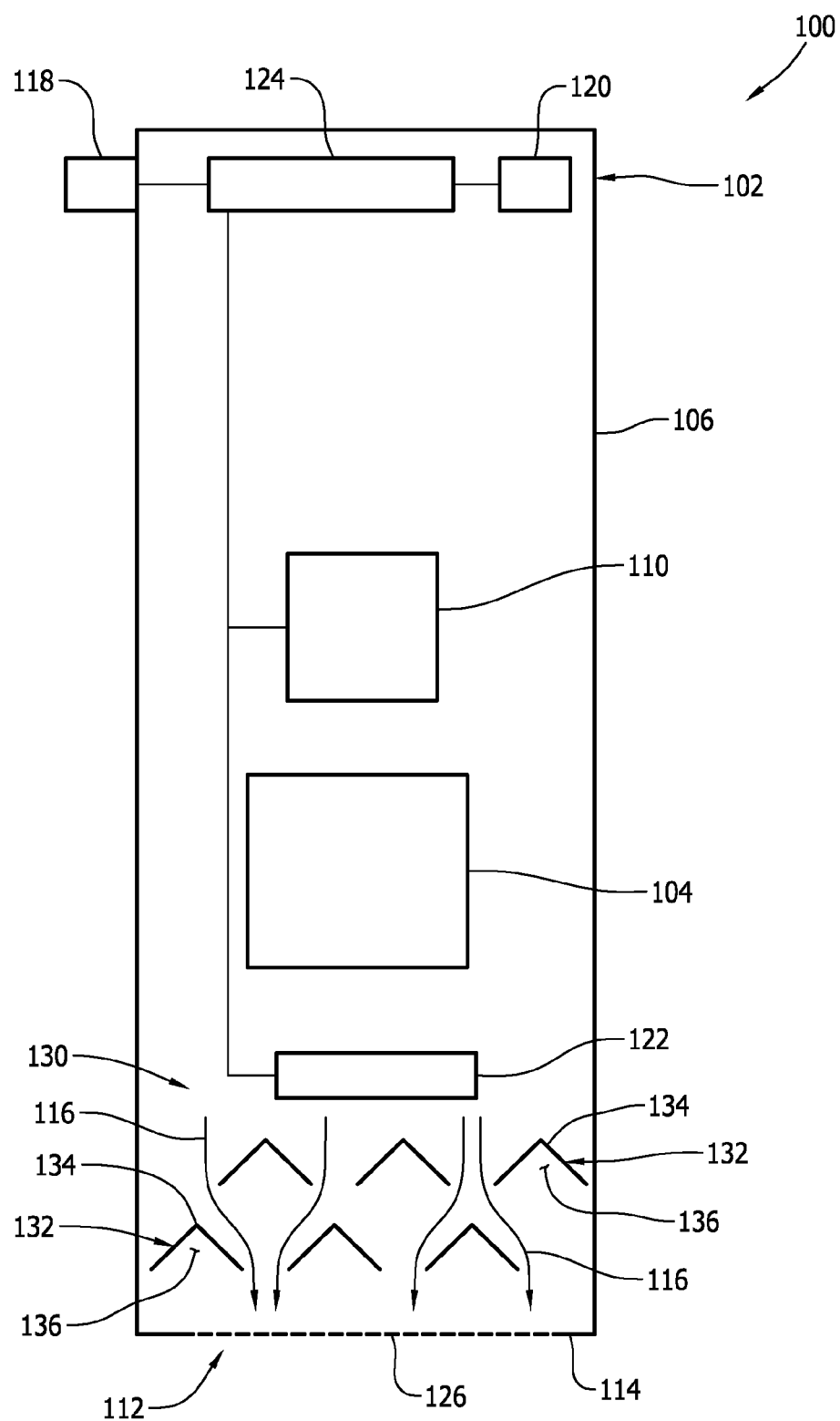
FIG. 2 is the side elevation view of FIG. 1 with arrows added to illustrate flow of air out of the housing of the enclosure.
Figure 3:
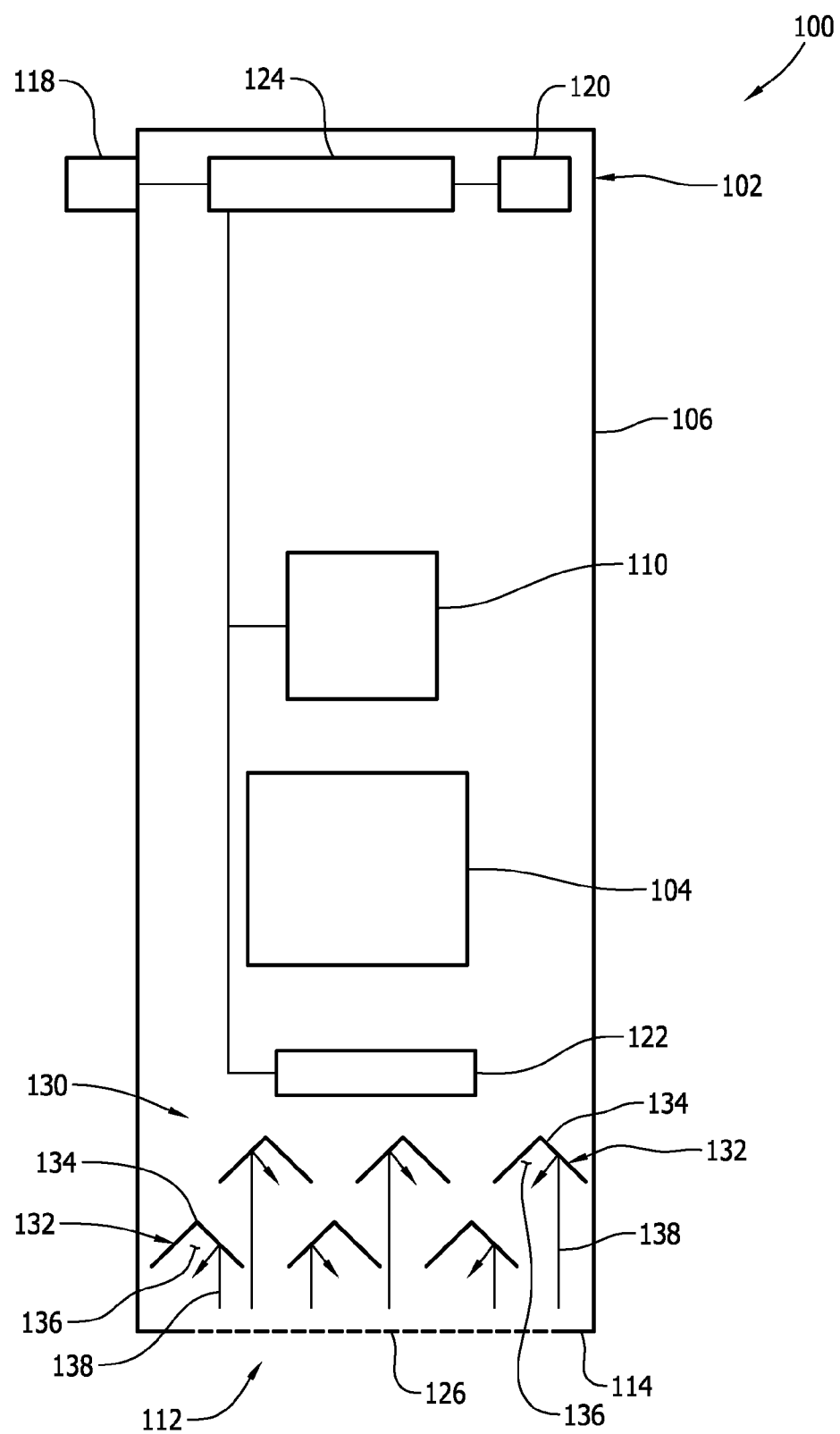
FIG. 3 is the side elevation view of FIG. 1 with arrows added to illustrate operation of a backflow assembly of the enclosure to inhibit movement of unwanted materials through the housing of the enclosure between an exhaust opening of the housing and components located within the housing generally above the backflow assembly.

FIGS. 1-3 illustrate an enclosure 100 according to one example embodiment of the present disclosure. A side portion of the enclosure 100 is removed to help illustrate internal components. The illustrated enclosure 100 includes a housing 102 (or shroud) for containing desired electronic equipment 104, and a forward panel 106 (or cover) that is selectively releasable/removable from the housing 102 to allow access into the housing 102 (and the electronic equipment 104 therein) as needed and to close the housing 102 when such access is not needed. The forward panel 106 of the housing 102 can be coupled to the housing 102 by any suitable fasteners including, for example, mechanical fasteners such as screws, bolts, clamps, magnets, etc. and can be sealed as desired. Alternatively, the forward panel 106 of the housing 102 may include a door pivotally coupled to the housing 102 for allowing selective access to the electronic equipment 104 in the housing 102.

The illustrated enclosure 100 includes a fan 110 located within the housing 102 to actively move, circulate, etc. air through the housing 102 and around the electronic equipment 104. This airflow helps control temperature and/or humidity of the environment in the housing 102. In the illustrated embodiment, the fan 110 is centrally located within the housing 102 generally above the electronic equipment 104. As such, when operating, the fan 110 directs air in the housing 102 generally downwardly, past the electronic equipment 104, and to an exhaust opening 112 located in a bottom portion 114 of the housing 102. Arrows 116 in FIG. 2 illustrate this example flow of air. Other airflow directions, patterns, etc. may be provided within the scope of the present disclosure (e.g., by varying the location of the fan 110 and/or the exhaust opening 112, etc.).

It should be appreciated that any suitable fan 110 can be used with the enclosure 100. In addition, the fan 110 may have one or more discrete speeds, and may be a variable-speed fan 110 as desired. In this manner, the fan 110 can generate air flow through the housing 102 and around, through, etc. the electronic equipment 104 horizontally, vertically and/or at other angles as may be necessary or desired. In addition, the enclosure 100 of this embodiment may also include at least one additional fan (not illustrated) to help further move air in the housing 102 (e.g., draw air into the housing 102, push air out of the housing 102, circulate air within the housing 102, etc.). When such additional fans are employed, they are preferably sized and/or operated so that, when in use with the fan 110, they maintain a positive pressure (or at least a zero pressure) within the housing 102.

With continued reference to FIGS. 1-3, the illustrated enclosure 100 also includes a sensor 118 for measuring an external air temperature (e.g., an ambient air temperature, etc.) outside of the enclosure 100, a sensor 120 for measuring an internal air temperature within the housing 102 of the enclosure 100, a heater 122, and a controller 124 operatively coupled to the sensors 118, 120, the fan 110, and the heater 122. The controller 124 may be a separate component, such as an environmental control unit, or may be integrated with the fan 110, heater 122, sensors 118, 120, and/or other components of the enclosure 100. And, any suitable sensors and/or heaters may be used as needed.

The controller 124 is configured to selectively operate the fan 110 and/or the heater 122 to help maintain a desired temperature and/or humidity and/or range thereof within the housing 102 of the enclosure 100. For example, under typical operating conditions, the controller 124 can reduce the temperature within the housing 102 by turning on or increasing a speed of the fan 110. Conversely, the controller 124 can typically increase the temperature within the housing 102 by turning off or decreasing the speed of the fan 110 and/or by turning on the heater 122. In this manner, the controller 124 can help, for example, to control temperature within the housing 102 and/or inhibit formation of condensation within the housing 102.

As an example, the controller 124 can be configured to selectively operate the fan 110 and/or heater 122 to help maintain, establish, etc. a desired (e.g., a predetermined, etc.) temperature differential between the external air temperature outside of the enclosure 100 and the internal air temperature within the housing 102 of the enclosure 100. As an alternative to maintaining a temperature differential, the controller 124 may be configured to instead maintain a particular, predetermined temperature (or temperature range) within the enclosure 100 (regardless of the external temperature outside of the enclosure 100 and, for example, based on thermal operating limits of electronic equipment 104 within the enclosure 100, etc.).

As another example, the controller 124 can be configured to maintain a desired humidity within the housing 102 of the enclosure 100 (e.g., to avoid unwanted condensation and corrosion within the enclosure 100, etc.). In this regard, the enclosure 100 may further include additional components such as, for example, one or more humidity sensors, one or more air conditioning units, etc. to help control humidity (and, as desired, temperature) within the housing 102.

With reference again to FIGS. 1-3, also in the illustrated embodiment, a screen 126 is disposed generally within the exhaust opening 112. The screen 126 includes openings that are configured (e.g., sized, shaped, spaced, etc.) to allow air to flow through the screen 126 (and through the exhaust opening 112) into and out of the housing 102. However, the openings are configured to inhibit unwanted materials having sizes larger than the openings from entering the housing 102 (e.g., animals, rocks, trash, etc.).

A backflow assembly 130 is provided between the exhaust opening 112 and the components (e.g., the electronic equipment 104, fan 110, sensors 118, 120, heater 122, controller 124, etc.) in the housing 102. The backflow assembly 130 operates to inhibit further movement through the housing 102 of smaller unwanted materials (e.g., salt, dust, mist, snow, etc.) not blocked by the screen 126. For example, when the fan 110 is operating, it pushes the air in the housing 102 generally downwardly, past the electronic equipment 104, and out of the housing 102 through the exhaust opening 112. This airflow creates a positive pressure in the housing 102 that typically tends to prevent the smaller unwanted materials from entering the housing 102 through the exhaust opening 112. However, when the fan 110 is not operating, this positive pressure resistance to the smaller unwanted materials is not present. And, gusts of wind, temperature changes, pressure changes, other backflow forces, etc. may cause air to flow into the housing 102 through the exhaust opening 112 (and the screen 126) and carry such smaller unwanted materials therewith. In this regard, the backflow assembly 130 prevents these smaller unwanted materials, that pass through the screen 126, from being further carried by the inflow of air to the electronic equipment 104, fan 110, sensors 118, 120, heater 122, controller 124, etc. in the housing 102.

The backflow assembly 130 of the illustrated embodiment includes multiple vanes 132 extending lengthwise across the housing 102 (i.e., into the page in FIGS. 1-3). The vanes 132 are coupled to the housing 102 by suitable fasteners (such that during use, the vanes 132 are non-moveably, fixedly, etc. held in place). The vanes 132 each have a shape generally corresponding to an inverted English alphabetic letter "V". A vertex portion 134 of each of the vanes 132 is oriented generally upwardly toward the fan 110, and a channel portion 136 of each of the vanes 132 is oriented generally downwardly toward the exhaust opening 112. This unique geometry, shape, etc. of the vanes 132 allows air leaving the housing 102 (e.g., exhaust air, etc.) to generally flow freely by the vertex portions 134 of the vanes 132 without interference (as illustrated by the arrows 116 in FIG. 2). However, air entering the housing 102 through the exhaust opening 112 encounters the channel portions 136 of the vanes 132, disrupting and diverting the inflowing air and resulting in slowed turbulent flow into the housing 102 (as illustrated by arrows 138 in FIG. 3).

In addition, the vanes 132 of the backflow assembly 130 are arranged in a generally offset, staggered pattern. In the illustrated embodiment, three vanes 132 are located in an upper row (toward the heater 122) and are generally offset from and partially overlapping portions of the three vanes 132 in a lower row (toward the exhaust opening (112). A straight vertical path does not exist through the vanes 132 from the exhaust opening 112 to the electronic equipment 104, fan 110, etc. in the housing 102 (FIG. 3). Instead, the inflowing air must curve, bend, etc. to move through the vanes 132. As such, this unique orientation of the vanes 132 generally prevents straight-line flows of air entering the enclosure 100 through the exhaust opening 112 from reaching the electronic equipment 104, fan 110, etc. in the housing 102 (e.g., air flow cannot follow a straight path through the exhaust opening 112 and past the vanes 132 of the backflow assembly 130 to the electronic equipment 104, fan 110, etc. in the housing 102).

As described, the example configuration (e.g., the inverted "V" shape and the offset, staggered orientation, etc.) of the vanes 132 in the illustrated enclosure 100 allows air to flow out of the housing 102 when the fan 110 is operating (FIG. 2) as well as into the housing 102 as acceptable. The vanes 132 allow both of these flows of air without moving or being adjusted. In addition, with regard to the air flowing into the enclosure 100, the vanes 132 operate to disrupt and reduce velocity of the inflowing air, in turn reducing momentum of unwanted materials carried in the air and causing them to fall out. For example, unwanted solids in the inflowing air become too heavy to remain suspended and fall out before reaching the electronic equipment 104, fan 110, etc. And, unwanted moisture in the inflowing air coalesces and similarly falls out before reaching the electronic equipment 104, fan 110, etc. The removed materials simply fall back out of the enclosure 100 through the exhaust opening 112. In this regard, the vanes 132 operate to protect the electronic equipment 104, fan 110, sensors 118, 120, heater 122, controller 124, etc. in the housing 102 from the unwanted materials. In addition, the vanes 132 are capable of doing so without the need to completely close and/or seal the exhaust opening 112.

It should be appreciated that the backflow assembly 130 of the illustrated enclosure 100 could include vanes having shapes, geometries, etc. other than the inverted "V" shapes. For example, the backflow assembly 130 could include one or more vanes having a shape similar to an inverted English alphabetic letter "U", and/or a shape similar to an elongated dash, such as "–", and/or even a shape similar to a tilde sign, such as "~". Still further, the backflow assembly 130 could include one or more vanes having other suitable shapes (or combinations of shapes) that, for example, operate to disrupt and reduce velocity of air flowing into the housing 102 through the exhaust opening 112 so that momentum of any unwanted materials in the air is reduced (causing the unwanted materials to fall out of the air before reaching the electronic equipment 104, fan 110, etc. in the housing 102). In addition, it should be appreciated that the vanes 132 (or any other vanes) need not extend completely across the housing 102 to still operate as needed.

It should also be appreciated that the backflow assembly 130 of the illustrated enclosure 100 could include arrangements of vanes 132 other than the two rows of three vanes 132 provided in the illustrated embodiment. For example, the backflow assembly 130 could include three or more rows of vanes 132 with each row having any desired number of vanes 132 (e.g., one, two, three, four, five, etc.). And, the vanes 132 can be arranged in any suitable offset, staggered, etc. pattern with respect to other vanes 132 so that, for example, a straight path (e.g., a straight vertical path, a straight horizontal path, a straight path oriented at an angle from a horizon, etc.) does not exist through the vanes 132 from the exhaust opening 112 to the equipment in the housing 102. Further, the backflow assembly 130 could include arrangements of the vanes 132 other than parallel. For example, at least one or more of the vanes 132 could be arranged askew to other vanes 132, perpendicular to other vanes 132, etc.

As previously described, the illustrated enclosure 100 includes the housing 102 and the forward panel 106 which selectively allows access to the equipment within the housing 102. While not illustrated, the forward panel 106 could include an intake opening located adjacent the fan 110 to allow air to flow into the housing 102 when the fan 110 is operating (e.g., to allow air to be drawn into the housing 102 by the fan 110, etc.). And, a screen 126 may be provided over the intake opening to help inhibit unwanted materials from being drawn into the housing 102 with the inflow of air. In addition, a backflow assembly similar to backflow assembly 130 could be provided adjacent the intake opening to help inhibit similar movement of smaller unwanted materials (e.g., dust, salt, mist, snow, etc.) through the housing 102 not blocked by the intake screen. A collection assembly (e.g., a pan, a channel system, a diversion system, etc.) may also be included to collect and/or dispose of the materials that are removed from the inflow of air.

Figure 4:
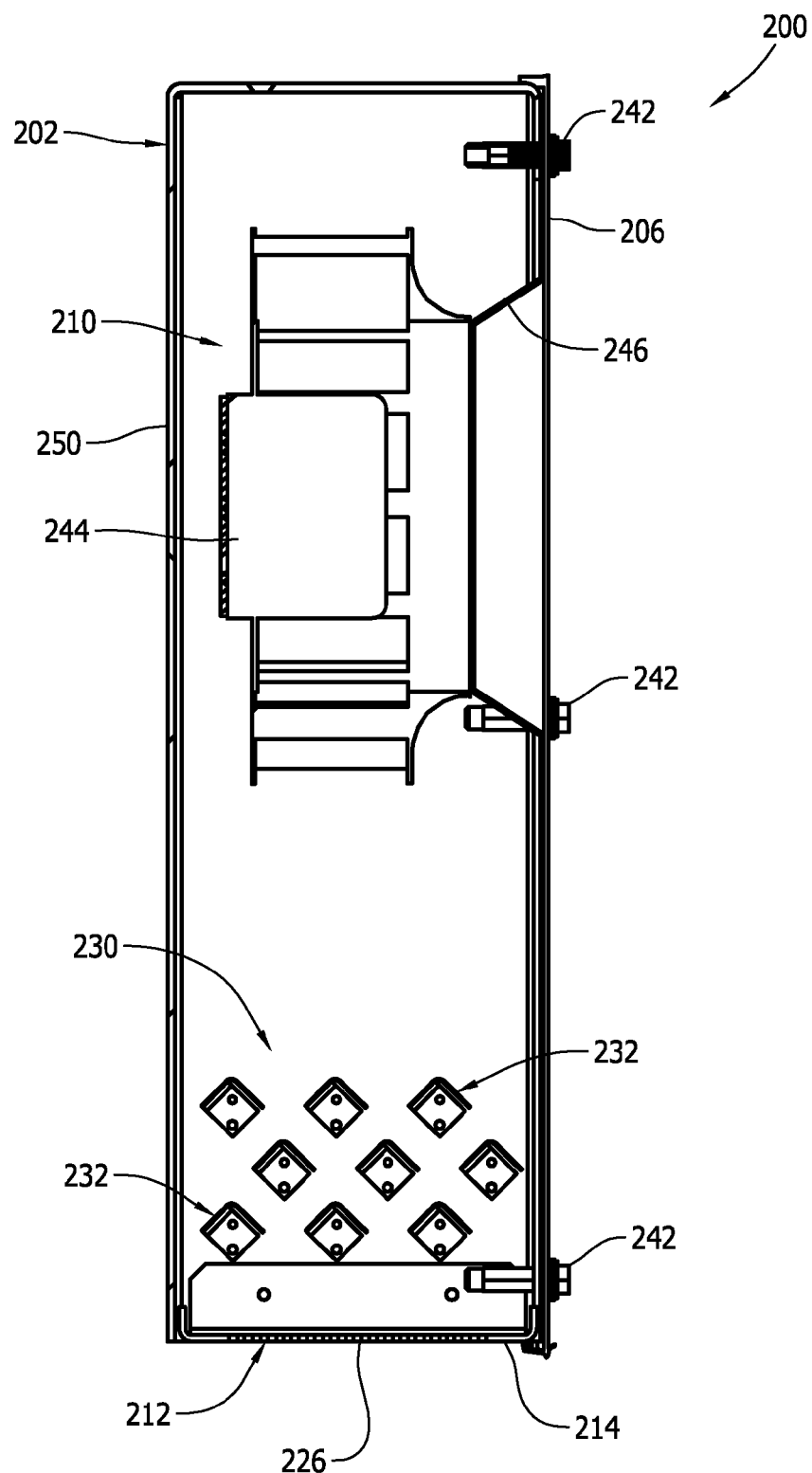
FIG. 4 is a side elevation view of an electronic equipment enclosure according to another example embodiment of the present disclosure, with part of a housing of the enclosure removed to shown internal components of the enclosure.
Figure 5:
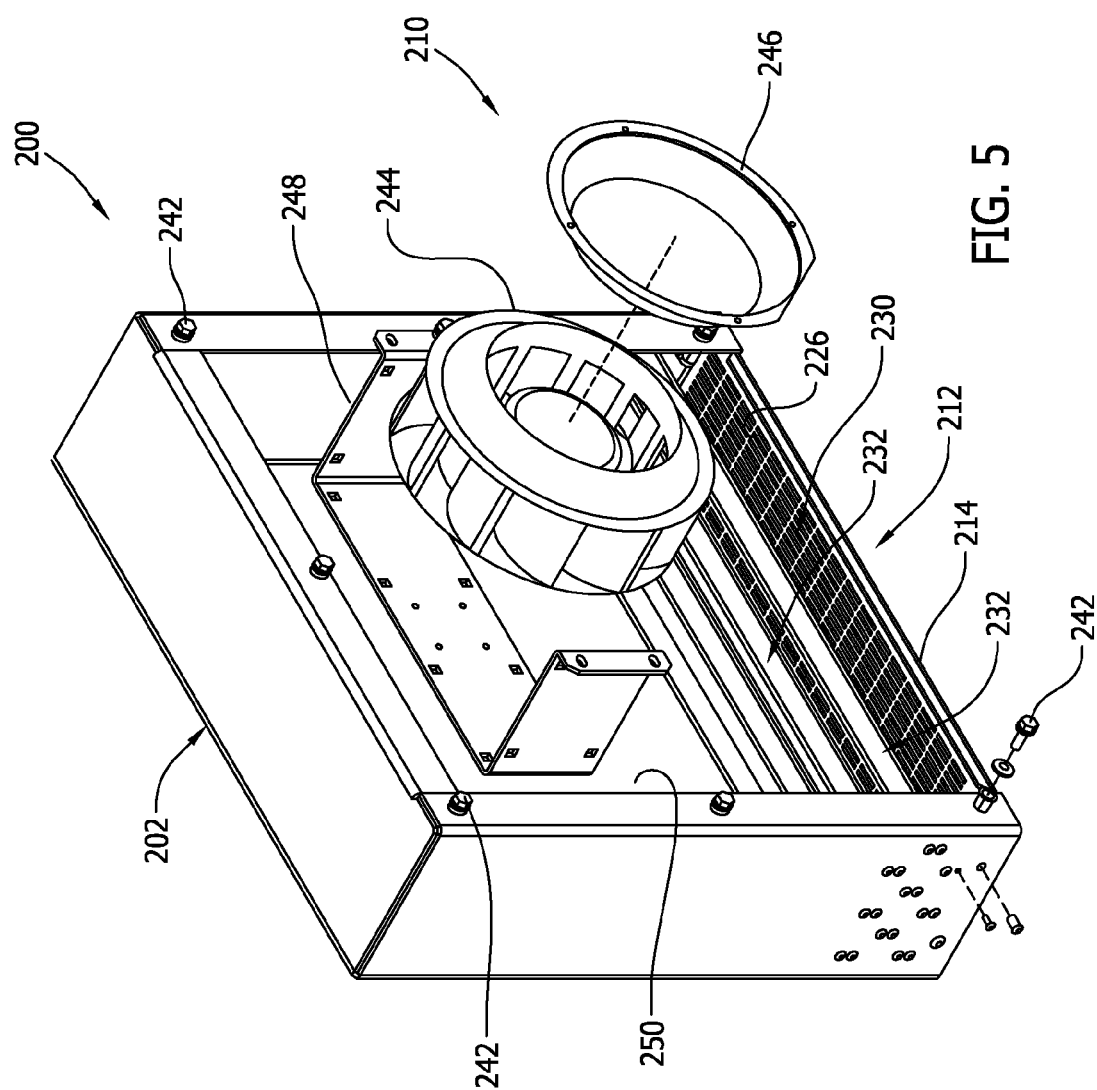
FIG. 5 is a partially exploded perspective view of the enclosure of FIG. 4, with a forward panel of the housing removed.
Figure 6:
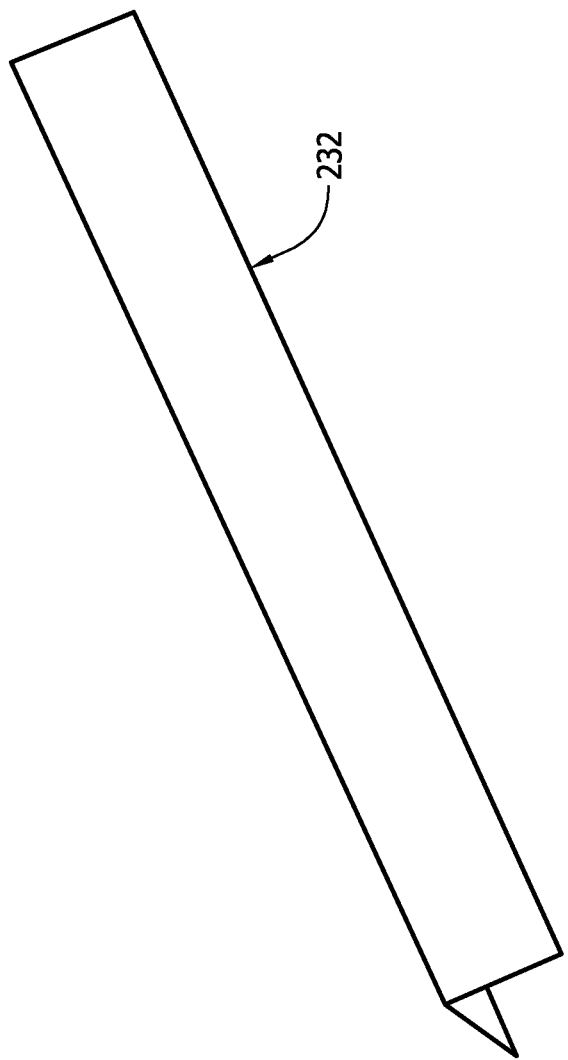
FIG. 6 is a perspective view of an individual vane of a backflow assembly of the enclosure of FIG. 4.

FIGS. 4-6 illustrate an enclosure 200 according to another example embodiment of the present disclosure. The enclosure 200 is substantially similar to the enclosure 100 previously described and illustrated in FIGS. 1-3, with the exception that the enclosure 200 is not illustrated with a heater, sensors, a control, or electronic equipment therein (although one or more of these components could readily be included as described in connection with enclosure 200).

FIG. 4 is a side view of the enclosure 200 with a side portion removed to help illustrate internal components. The enclosure 200 includes a housing 202 (or shroud) for containing desired equipment, and a forward panel 206 (or cover) releasably/removably coupled to the housing 202 by fasteners 242 to allow access into the housing 202 as needed and to close the housing 202 when such access is not needed. A seal can be provided around the housing 202 and/or the forward panel 206 as desired.

With additional reference to FIG. 5 (which is a partial exploded view of the enclosure 200 with the forward panel 206 removed), the enclosure 200 includes a fan 210 located within the housing 202 and operable to actively move, circulate, etc. air through the housing 202. The illustrated fan 210 is a centrifugal fan 210 having a backward-curved impeller 244 and an inlet ring 246 for receiving air and circulating it within the housing 202. A bracket 248 coupled to a rearward wall 250 of the housing 202 is provided for mounting the fan 210 in the housing 202. And, while the fan 210 is illustrated in a generally central portion of the housing 202 in the figures, it could be located differently by moving the bracket 248 as desired.

With reference to FIGS. 4-6, the enclosure 200 includes an exhaust opening 212 located in a bottom portion 214 of the housing 202 and a backflow assembly 230 positioned generally above the exhaust opening 212. The exhaust opening 212 allows air to flow into and out of the housing 202 as needed. And, a screen 226 is provided within the exhaust opening 212 to inhibit unwanted materials having sizes larger than openings in the screen 226 from entering the housing 202 (e.g., animals, rocks, trash, etc.). The backflow assembly 230 operates to further inhibit movement through the housing 202 of smaller unwanted materials (e.g., dust, salt, mist, snow, etc.) not blocked by the screen 226 (e.g., material carried through the exhaust opening 212 and screen 226 via gusts of wind, temperature changes, pressure differentials, etc.).

The backflow assembly 230 of the illustrated embodiment includes multiple vanes 232 extending lengthwise across the housing 202. The vanes 232 each have a shape generally corresponding to an inverted English alphabetic letter "V". This unique geometry, shape, etc. of the vanes 232 allows air leaving the housing 202 (e.g., exhaust air, etc.) to generally flow freely past the vanes 232 without interference. However, air entering the housing 202 through the exhaust opening 212 is disrupted and diverted by the vanes 232, resulting in slowed turbulent air flow into the housing 202.

In addition, the vanes 232 of the backflow assembly 230 are arranged in a generally offset, staggered pattern. And, in the illustrated embodiment, the three vanes 232 in an upper and lower row are generally offset from and partially overlapping portions of three vanes 232 in a middle row. In addition, the vanes 232 in the upper and lower rows are generally aligned. As such, a straight vertical path does not exist through the vanes 232 from the exhaust opening 212 to the fan 210, etc. in the housing 202. Thus, this unique orientation of the vanes 232 generally prevents straight-line flows of air entering the enclosure 200 through the exhaust opening 212 from reaching the fan 210, etc. in the housing 202. In this regard, the vanes 232 can provide protection to the fan 210, etc. against unwanted materials being carried by the inflowing air.

Figure 7:
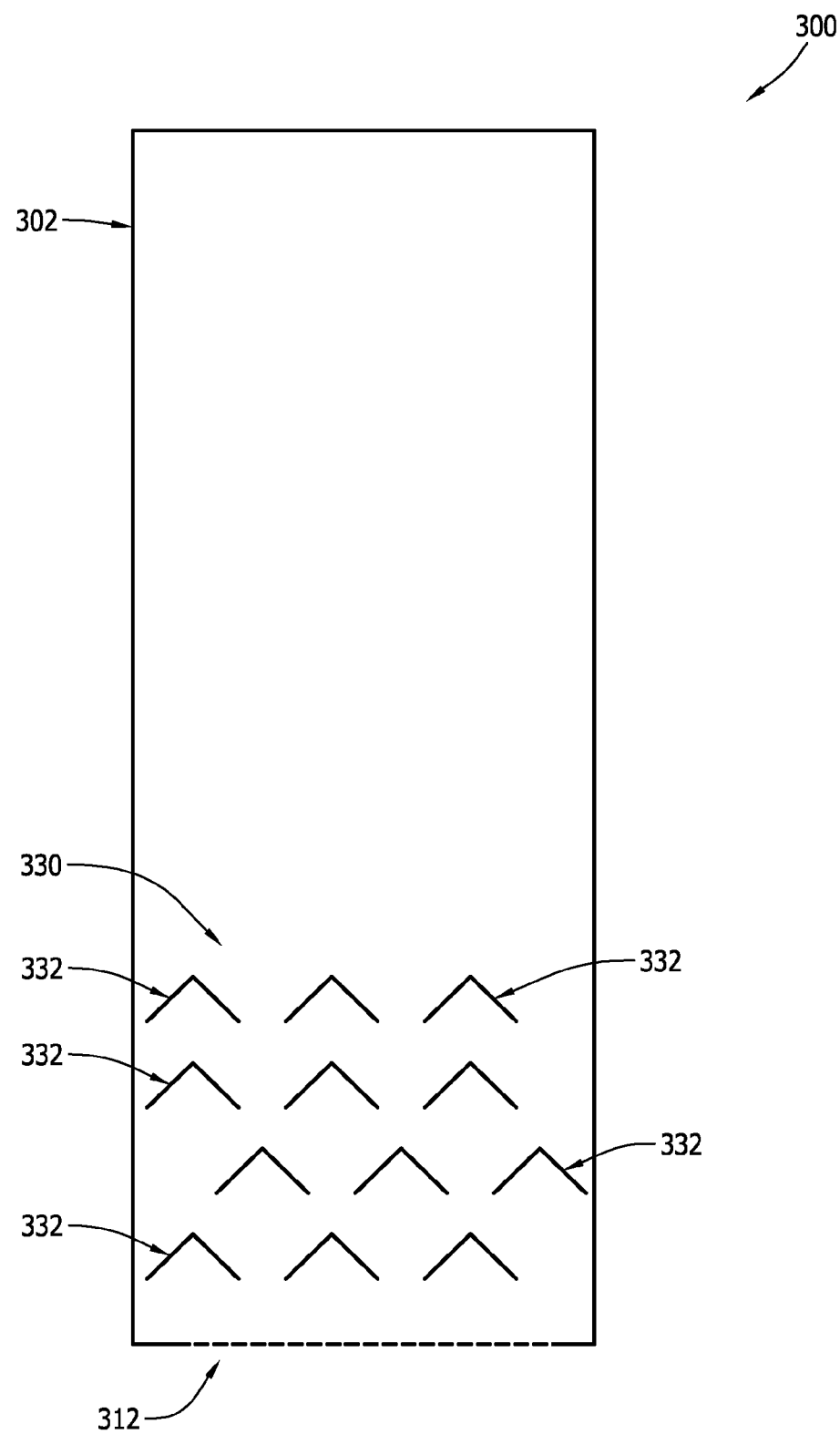
FIG. 7 is a side elevation view of an example configuration of vanes of a backflow assembly suitable for use with any of the enclosures of the present disclosure.

FIG. 7 illustrates a backflow assembly 330 installed in an electronic equipment enclosure 300 according to still another example embodiment of the present disclosure. In this embodiment, only a portion of the enclosure 300 is shown. However, it should be appreciated that the enclosure is substantially similar to the enclosures 100, 200 previously described and illustrated in FIGS. 1-6. In addition, it should also be appreciated that the backflow assembly 330 of this embodiment could readily be employed with any of the example enclosures of the present disclosure.

The backflow assembly 330 of the illustrated embodiment includes multiple vanes 332 extending lengthwise across a housing 302 of the enclosure 300. The vanes 332 each have a shape generally corresponding to an inverted English alphabetic letter "V". This unique geometry, shape, etc. of the vanes 332 allows air leaving the housing 302 (e.g., exhaust air, etc.) to generally flow freely by the vanes 332 without interference. However, air entering the housing 302 through an exhaust opening 312 encounters the vanes 332, which disrupt and divert the inflowing air and result in slowed turbulent flow into the housing 302.

In addition, in this embodiment the vanes 332 of the backflow assembly 330 are arranged in a generally offset, staggered pattern, with three vanes 332 in a top, first row (as viewed in FIG. 7) generally aligned with three vanes 332 in a lower, second row located immediately below the upper, first row. In addition, the three vanes 332 in the second row and three vanes 332 in a bottom, fourth row are generally offset from and partially overlap portions of three vanes 332 in a third row. As such, a straight path does not exist through the vanes 332 from the exhaust opening 312 to a location in the housing 302 past the backflow assembly 330. Thus, this unique orientation of the vanes 332 generally prevents straight-line flows of air entering the enclosure through the exhaust opening 312 from reaching equipment (e.g., electronic equipment, fans, etc.) in the housing 302.

Figure 8:
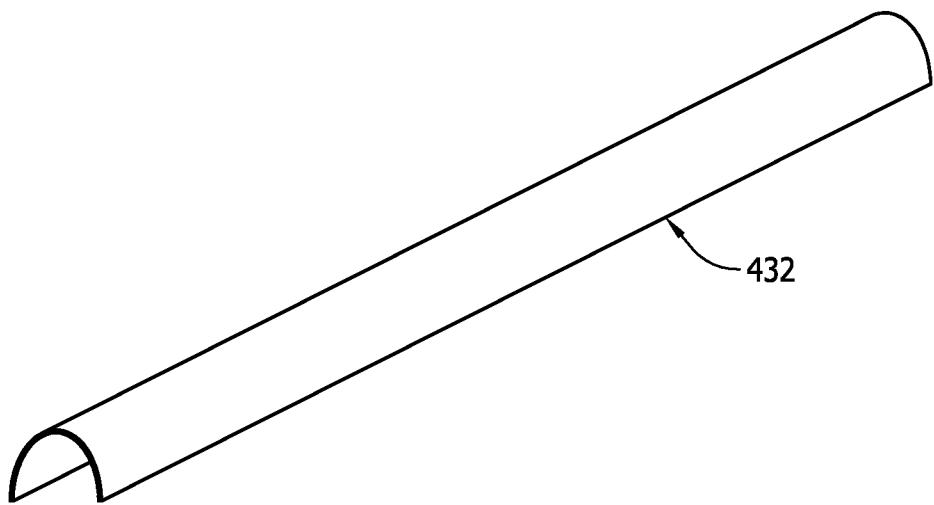
FIG. 8 is a perspective view of an example vane of a backflow assembly suitable for use with any of the enclosures of the present disclosure.

FIG. 8 illustrates an example vane 432 suitable for use with any of the example enclosures of the present disclosure. Here, the example vane 432 includes a shape similar to an inverted English alphabetic letter "U".

Figure 9:
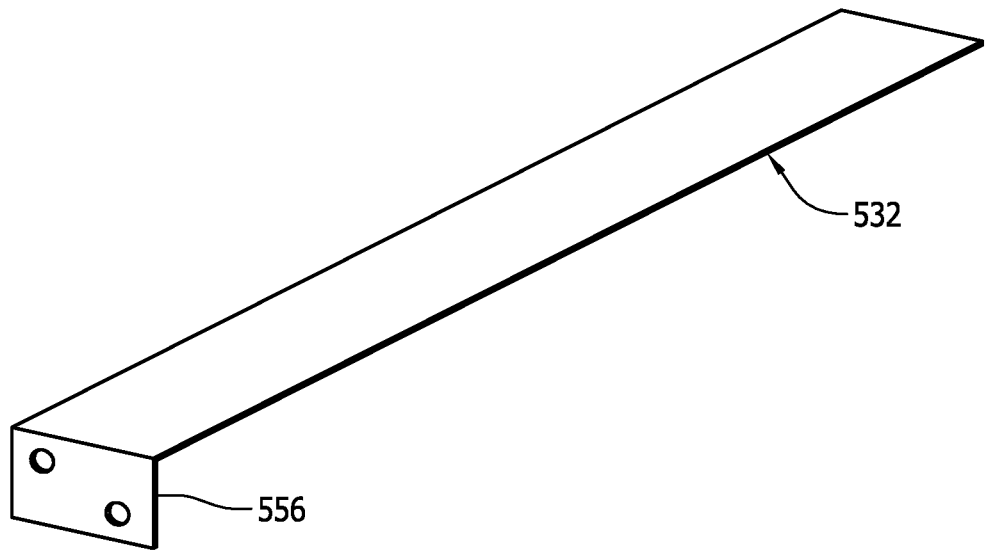
FIG. 9 is a perspective view of another example vane of a backflow assembly suitable for use with any of the enclosures of the present disclosure.

FIG. 9 illustrates another example vane 532 suitable for use with any of the example enclosures of the present disclosure. Here, the example vane 532 includes a shape similar to an elongated dash, such as "–". In addition, the vane 532 is shown with a mounting bracket 556 that can be used to couple the vane to a housing of an enclosure.

The present disclosure also provides unique methods for making enclosures that are operable to inhibit ingress of unwanted materials (e.g., solid particles such as dust and salt, moisture such as mist and snow, etc.) into the enclosures. For example, one example method provides for making an electronic equipment enclosure suitable for housing electronic equipment and at least one fan for circulating air in the electronic equipment enclosure around the electronic equipment, wherein the electronic equipment enclosure includes a backflow assembly configured to inhibit movement of unwanted materials through a housing of the electronic equipment enclosure from a vent opening of the housing to the at least one fan of the housing. Here, the method generally includes coupling multiple vanes of the backflow assembly to the housing between the vent opening and the at least one fan, and arranging the multiple vanes of the backflow assembly to block a straight path into the housing from the vent opening to the at least one fan.

Example methods may further include arranging the multiple vanes to inhibit movement of unwanted materials through the housing from the vent opening to the at least one fan without closing and/or sealing the vent opening, and/or arranging the multiple vanes in at least two rows with each of the at least two rows including at least three vanes, and/or orienting the multiple vanes such that a channel portion of each of the vanes is directed toward the vent opening. Still further, example methods can include installing electronic equipment in the housing of the electronic equipment enclosure.

As can now be appreciated, the unique backflow assemblies of the example enclosures disclosed herein operate to effectively inhibit flow of unwanted materials into electronic equipment enclosures through vent openings. And in various embodiments, this is achieved without use of filters (and the need for replacing such filters and/or cleaning clogged filters) or complicated moving structures such as dampers, baffles, valves, etc. For example, vanes of various backflow assemblies disclosed herein can be non-movably coupled to housings of the enclosures and still operate to effectively inhibit flow of unwanted materials into the enclosures through vent openings. In addition, vanes of various backflow assemblies are configured to resist clogging with unwanted materials removed from the air flows (e.g., they are oriented to avoid collecting the materials, they are spaced sufficiently apart to avoid trapping the materials between the vanes, etc.).

However, with that said it should still be understand that, even though not required, embodiments of enclosures of the present disclosure could include filters (e.g., hydrophobic filters, membrane filters, etc.) positioned within airflow paths to further help inhibit movement of unwanted materials into, through, etc. the enclosures. Similarly, embodiments of enclosures of the present disclosure could include dampers (e.g., pressure sensitive dampers such as those disclosed in U.S. 2011/0159795, which is incorporated herein by reference, etc.) and/or moveable covers (e.g., ventilation covers such as those disclosed in U.S. Pat. No. 7,345,875, which is incorporated herein by reference, etc.) to further help inhibit ingress, movement, etc. of unwanted materials into and through the enclosures.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An electronic equipment enclosure comprising:
a housing including a first vertical extending side, a second vertical extending side opposing the first vertical extending side, an upper portion, and a bottom portion opposing the upper portion, the housing configured to hold electronic equipment between the opposing vertical extending sides;
a first vent opening defined in the electronic equipment enclosure and located in the bottom portion of the housing, the first vent opening configured to allow air to flow into or out of the electronic equipment enclosure;
a second vent opening defined in the electronic equipment enclosure and located in the upper portion of the housing to create an airflow path between the second vent opening and the first vent opening;
at least one fan positioned within the housing and configured to move air within the housing from the second vent opening to the first vent opening;
a first plurality of vanes arranged in a first row and disposed within the electronic equipment enclosure adjacent the first vent opening, one or more of the first plurality of vanes disposed directly under the electronic equipment when the electronic equipment is between the opposing vertical extending sides; and
a second plurality of vanes arranged in a second row positioned above the first row, the first row offset with respect to the second row to block a straight path from the first vent opening into the electronic equipment enclosure past the multiple vanes,
one of the vanes of the first row adjacent the first vertical extending side of the housing and one of the vanes of the second row adjacent the second vertical extending side of the housing,
the first plurality of vanes and the second plurality of vanes configured to inhibit at least some unwanted materials carried by air entering the first vent opening from passing when the at least one fan is not operating.

2. The electronic equipment enclosure of claim 1, wherein the first plurality of vanes and the second plurality of vanes are configured to disrupt and reduce velocity of the air after the air has passed through the first vent opening to thereby reduce momentum of unwanted materials carried in the air such that at least some of the unwanted materials fall out of the air before the air flows past the vanes.

3. The electronic equipment enclosure of claim 2, wherein the first plurality of vanes and the second plurality of vanes each include a channel portion oriented generally toward the first vent opening.

4. The electronic equipment enclosure of claim 3, wherein at least one of the first plurality of vanes or at least one of the second plurality of vanes has a shape generally corresponding to an English alphabetic letter "V".

5. The electronic equipment enclosure of claim 1, wherein the first plurality of vanes and the second plurality of vanes are configured to, without moving, both inhibit unwanted materials in the air received through the first vent opening from moving further into the electronic equipment enclosure beyond the vanes and allow air to flow out of the first vent opening from the electronic equipment enclosure.

6. The electronic equipment enclosure of claim 5, wherein the first plurality of vanes and the second plurality of vanes are configured to inhibit the unwanted materials in the air received through the first vent opening from moving beyond the vanes and further into the electronic equipment enclosure without closing and/or sealing the first vent opening.

7. The electronic equipment enclosure of claim 5, wherein the first plurality of vanes and the second plurality of vanes are fixedly coupled to the electronic equipment enclosure.

8. The electronic equipment enclosure of claim 1, wherein the first plurality of vanes and the second plurality of vanes each include at least three vanes.

9. The electronic equipment enclosure of claim 8, further comprising a third plurality of vanes arranged in a third row positioned above the second row, the first plurality of vanes generally aligned with the third plurality of vanes as viewed through the first vent opening.

10. The electronic equipment enclosure of claim 1, wherein the first plurality of vanes and the second plurality of vanes are disposed within the electronic equipment enclosure between the first vent opening and the at least one fan.

11. The electronic equipment enclosure of claim 1, further comprising a screen covering at least part of the first vent opening, the first plurality of vanes and the second plurality of vanes disposed within the electronic equipment enclosure at a location spaced apart from the screen.

12. A method of making an electronic equipment enclosure suitable for housing electronic equipment and at least one fan for circulating air in the electronic equipment enclosure around the electronic equipment, wherein the electronic equipment enclosure includes a housing having a first vertical extending side, a second vertical extending side opposing the first vertical extending side, an upper portion, and a bottom portion opposing the upper portion, a first vent opening located in the bottom portion of the housing, a second vent opening located in the upper portion of the housing to create an airflow path between the second vent opening and the first vent opening, at least one fan configured to move air within the housing from the second vent opening to the first vent opening, and a backflow assembly configured to inhibit at least some unwanted materials carried by air entering the first vent opening from passing when the at least one fan is not operating, the housing configured to hold electronic equipment between the opposing vertical extending sides, the method comprising:
coupling a first plurality of vanes of the backflow assembly to the housing in a first row between the first vent opening and the at least one fan, one or more of the first plurality of vanes disposed directly under the electronic equipment when the electronic equipment is between the opposing vertical extending sides, one of the vanes of the first row adjacent the first vertical extending side of the housing;

coupling a second plurality of vanes of the backflow assembly to the housing in a second row between the first vent opening and the at least one fan, one of the vanes of the second row adjacent the second vertical extending side of the housing; and arranging the first plurality of vanes and the second plurality of vanes of the backflow assembly so that the first row is offset with respect to the second row to block a straight path into the housing from the first vent opening to the at least one fan.

13. The method of claim 12, wherein arranging the first plurality of vanes and the second plurality of vanes further includes arranging the vanes to inhibit movement of unwanted materials through the housing from the vent opening to the at least one fan without closing and/or sealing the first vent opening.

14. The method of claim 12, wherein the first plurality of vanes and the second plurality of each include at least three vanes.

15. The method of claim 12, wherein arranging the first plurality of vanes and the second plurality of vanes further includes orienting the vanes such that a channel portion of each of the vanes is directed toward the first vent opening.

16. The method of claim 12, further comprising installing electronic equipment in the housing of the electronic equipment enclosure.

* * * * *